US012672490B2

(12) United States Patent
Zhu et al.

(10) Patent No.: US 12,672,490 B2
(45) Date of Patent: *Jun. 30, 2026

(54) DEPOSITION METHOD

(71) Applicant: ASM IP Holding B.V., Almere (NL)

(72) Inventors: Chiyu Zhu, Helsinki (FI); Henri Jussila, Espoo (FI); Qi Xie, Shanghai (CN)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/822,710

(22) Filed: Sep. 3, 2024

(65) Prior Publication Data

US 2024/0429055 A1     Dec. 26, 2024

Related U.S. Application Data

(63) Continuation of application No. 17/845,325, filed on Jun. 21, 2022, now Pat. No. 12,119,228, which is a
(Continued)

(51) Int. Cl.
*C23C 16/02*     (2006.01)
*C23C 16/04*     (2006.01)
(Continued)

(52) U.S. Cl.
CPC ........ *H10P 14/418* (2026.01); *C23C 16/0227* (2013.01); *C23C 16/04* (2013.01);
(Continued)

(58) Field of Classification Search
CPC ................ C23C 16/0227; C23C 16/04; C23C 16/45534; C23C 16/45553
See application file for complete search history.

(56) References Cited

U.S. PATENT DOCUMENTS 7,220,451 B2     5/2007 Aaltonen et al.
7,402,517 B2     7/2008 Yonker et al.
(Continued)

FOREIGN PATENT DOCUMENTS

CN     101166846 A   *  4/2008   ............. C23C 18/00
JP     S6314870 A      1/1988
(Continued)

OTHER PUBLICATIONS

Singh, Joseph A., et al., "Area-Selective Atomic Layer Deposition of Metal Oxides on Noble Metals through Catalytic Oxygen Activation". Chemistry of Materials 2018, 30, 663-670.*
(Continued)

*Primary Examiner* — Bret P Chen
(74) *Attorney, Agent, or Firm* — Snell & Wilmer L.L.P.

(57) ABSTRACT

A method of selectively depositing a material on a substrate with a first and second surface, the first surface being different than the second surface. The depositing of the material on the substrate comprises: supplying a bulk precursor comprising metal atoms, halogen atoms and at least one additional atom not being a metal or halogen atom to the substrate; and supplying a reactant to the substrate. The bulk precursor and the reactant have a reaction with the first surface relative to the second surface to form more material on the first surface than on the second surface.

20 Claims, 4 Drawing Sheets

Related U.S. Application Data continuation of application No. 16/337,301, filed as application No. PCT/IB2019/050974 on Feb. 7, 2019, now Pat. No. 11,393,690.

(60) Provisional application No. 62/619,579, filed on Jan. 19, 2018.

(51) Int. Cl.
| | |
|---|---|
| *C23C 16/455* | (2006.01) |
| *H10P 14/40* | (2026.01) |
| *H10W 20/00* | (2026.01) |

(52) U.S. Cl.
CPC .. *C23C 16/45534* (2013.01); *C23C 16/45553* (2013.01); *H10W 20/057* (2026.01)

(56) References Cited

U.S. PATENT DOCUMENTS

| | | | |
|---|---|---|---|
| 9,685,371 | B2 | 6/2017 | Zope et al. |
| 10,510,590 | B2 | 12/2019 | Thombare et al. |
| 11,230,764 | B2 | 1/2022 | Lehn et al. |
| 11,393,690 | B2 * | 7/2022 | Zhu .................. H01L 21/28568 |
| 12,119,228 | B2 * | 10/2024 | Zhu .................. H01L 21/28568 |
| 2003/0168001 | A1 | 9/2003 | Sneh |
| 2006/0223312 | A1 * | 10/2006 | Yonker ................... C23C 18/02 257/E21.171 |
| 2008/0142483 | A1 | 6/2008 | Hua et al. |
| 2014/0017904 | A1 * | 1/2014 | Gauri ................... C23C 16/401 438/778 |
| 2016/0002786 | A1 | 1/2016 | Gatineau et al. |
| 2016/0362784 | A1 | 12/2016 | Isobe et al. |
| 2017/0037513 | A1 * | 2/2017 | Haukka ................... C23C 16/04 |
| 2017/0062224 | A1 | 3/2017 | Fu et al. |
| 2017/0154895 | A1 | 6/2017 | Huo |
| 2017/0352550 | A1 * | 12/2017 | Tois ................. C23C 16/45553 |
| 2018/0019165 | A1 | 1/2018 | Baum et al. |
| 2018/0294187 | A1 | 10/2018 | Thombare et al. |
| 2018/0294197 | A1 | 10/2018 | Plano |
| 2018/0312966 | A1 | 11/2018 | Chan et al. |
| 2019/0067014 | A1 | 2/2019 | Shrestha et al. |
| 2019/0067094 | A1 | 2/2019 | Zope et al. |
| 2019/0103278 | A1 | 4/2019 | Hung et al. |
| 2020/0283894 | A1 | 9/2020 | Lehn et al. |
| 2020/0303195 | A1 | 9/2020 | Tapily |
| 2021/0125832 | A1 | 4/2021 | Bhatnagar |
| 2022/0013365 | A1 | 1/2022 | Van Cleemput et al. |
| 2022/0018016 | A1 | 1/2022 | Ma et al. |
| 2022/0195598 | A1 | 6/2022 | Collins et al. |
| 2022/0220139 | A1 | 7/2022 | Leoncini et al. |
| 2022/0220140 | A1 | 7/2022 | Leoncini et al. |
| 2022/0298624 | A1 | 9/2022 | Blakeney et al. |
| 2023/0295795 | A1 * | 9/2023 | Cabrera ........... H01J 37/32853 |

FOREIGN PATENT DOCUMENTS

| | | | |
|---|---|---|---|
| JP | H02025568 A | 1/1990 | |
| JP | H06208967 A | 7/1994 | |
| JP | H07106585 A | 4/1995 | |
| JP | 2008-108875 * | 5/2008 | ........... H01L 21/336 |
| JP | 2016098406 A | 5/2016 | |
| WO | 2021046058 A1 | 3/2021 | |

OTHER PUBLICATIONS

Lemaire, Paul C., et al., "Understanding inherent substrate selectivity during atomic layer deposition: Effect of surface preparation, hydroxyl density, and metal oxide composition on nucleation mechanisms during tungsten ALD". the Journal of Chemical Physics 146, 052811 (2017) pp. 1-9.*

* cited by examiner supplying a bulk precursor with a bulk pulse T2 — 11 removing a portion of the bulk precursor for a bulk removal period R2 — 13 supplying a reactant with a reactant pulse T3 — 15 removing a portion of the reactant for a reactant removal period R3 — 17

M times

2

DEPOSITION METHOD

CROSS-REFERENCE TO RELATED APPLICATIONS

This application is a continuation of, and claims priority to, U.S. patent application Ser. No. 17/845,325 filed Jun. 21, 2022, titled DEPOSITION METHOD; which is a continuation of U.S. patent application Ser. No. 16/337,301 filed Mar. 27, 2019, titled DEPOSITION METHOD (now U.S. Pat. No. 11,393,690 issued on Jul. 19, 2022); which is a 371 of PCT/IB2019/050974 filed Feb. 7, 2019, titled DEPOSITION METHOD, which claims the benefit of U.S. Provisional Patent Application No. 62/619,579 filed Jan. 19, 2018, titled DEPOSITION METHOD, the disclosures of which are hereby incorporated by reference in their entirety.

FIELD

The present disclosure generally relates to a method to deposit material on a substrate. More particularly, the disclosure relates to selective deposition of material on a first surface of a substrate relative to a second surface.

BACKGROUND

Integrated circuits are manufactured by an elaborate process in which various layers of materials are sequentially deposited in a predetermined arrangement on a semiconductor substrate. The predetermined arrangement of materials on a semiconductor substrate may often be accomplished by deposition of a material over the entire substrate surface, followed by removal of the material from predetermined areas of the substrate, such as for example by deposition of a mask layer and a subsequent etching process. The material may be conductive so as to provide for an electrical connection within the integrated circuit.

The number of steps involved in manufacturing an integrated surface on a substrate is very large making the production process very complex. The number of steps may be reduced by utilizing a selective deposition process, whereby a material is selectively deposited on a first surface relative to a second surface without the need, or with reduced need for subsequent processing.

SUMMARY

There may be a need for a method of selectively depositing a material on a first surface relative to a second surface.

Accordingly, there may be provided a method of selectively depositing a material on a substrate, comprising:

providing a substrate with a first and second surface, the first surface being different than the second surface;

depositing the material on the substrate by:

supplying a bulk precursor comprising metal atoms, halogen atoms and at least one additional atom not being a metal or halogen atom; and supplying a reactant to the substrate, whereby the bulk precursor and the reactant have a reaction with the first surface relative to the second surface to form more material on the first surface than on the second surface.

By supplying a bulk precursor comprising metal atoms, halogen atoms and at least one additional atom not being a metal or halogen atom the material may be deposited selectively on the first surface relative to the second surface to form more material on the first surface than on the second surface. The bulk precursor and the reactant may have a reaction with the first surface relative to the second surface to form more than 2, preferably more than 5, and most preferably more than 10 times more material on the first surface than on the second surface.

The bulk precursor may comprises a transition metal atom e.g. molybdenum. The deposited material may be conductive. The halogen atom may be a chloride. The at least one additional atom may be selected from the chalcogenides e.g. oxygen. The reactant may comprise hydrogen atoms.

In some embodiments, a method for semiconductor processing may be provided. The method may include selectively depositing a material comprising metal into a gap in the substrate, thereby filling the gap.

BRIEF DESCRIPTION OF THE DRAWINGS

These and other features, aspects, and advantages of the invention disclosed herein are described below with reference to the drawings of certain embodiments, which are intended to illustrate and not to limit the invention.

DETAILED DESCRIPTION

Integrated circuits are manufactured by a process in which various layers of materials are sequentially deposited in a predetermined arrangement on a semiconductor substrate. A metal layers may be required as a conducting layer in a semiconductor device to electrically connect some of these layers. The number of steps involved in manufacturing an integrated surface on a substrate may be reduced by utilizing a selective deposition process, whereby a material is selectively deposited on a first surface relative to a second surface without the need, or with reduced need for subsequent processing. It has been found that there may be a need for a method of selectively depositing a conducting material on a first surface relative to a second surface to provide an electrical connection.

Gaps created during manufacturing of a feature of an integrated circuit device may be provided with metal material. The gaps may have a high aspect ratio in that their depth is much larger than their width. Through these layers a gap may be provided for example by etching. There may be a need to provide a conducting material in the gap.

Figure 1B:
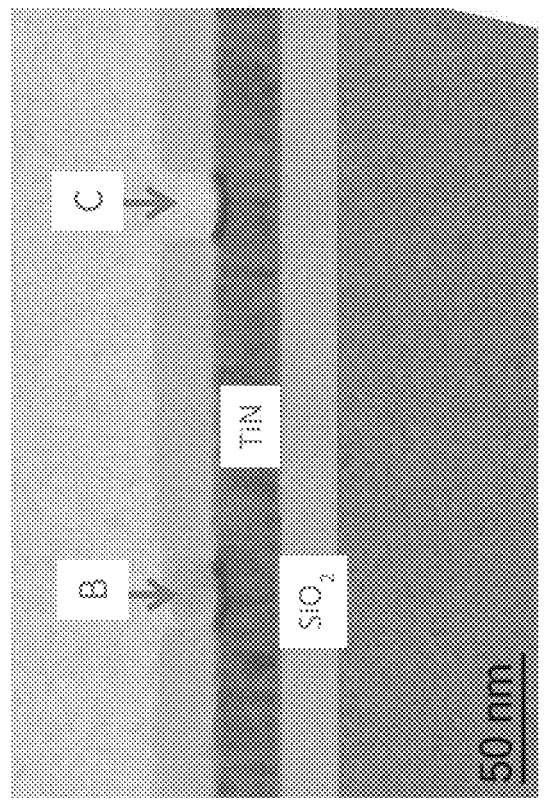
FIG. 1b discloses the same gaps as in FIG. 1a but shows that the metal deposition process may be hindered by contamination in the gaps.
Figure 1A:
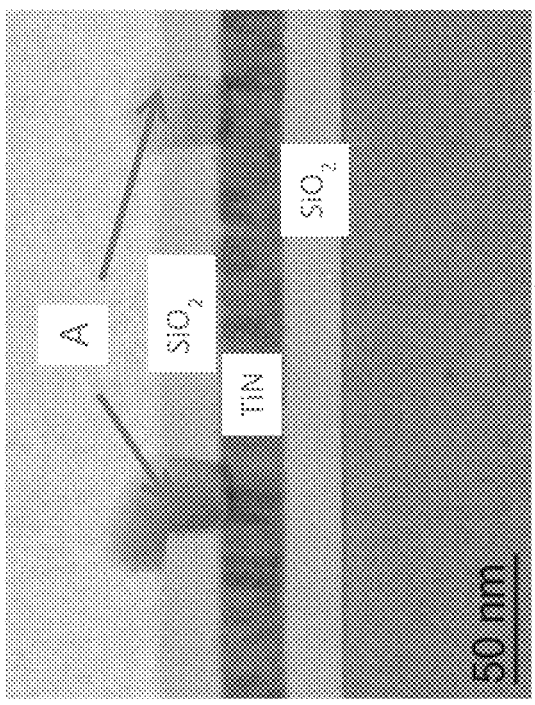
FIG. 1a discloses gaps A having a first (bottom) surface comprising a conductive and a second (side) surface comprising an insulator filled with metal according to an embodiment.

FIG. 1a disclose gaps A having a first (bottom) surface comprising a conductive metal e.g. tungsten or titanium nitride and a second (side) surface comprising an insulating oxide e.g. aluminum oxide $Al_2O_3$ or silicon dioxide $SiO_2$. The gaps A may be filled with a material deposited by supplying a bulk precursor and a reactant to the substrate. The bulk precursor and the reactant may have a reaction with the first surface relative to the second surface to form more material on the first surface than on the second surface.

Thereby the gap may be filled bottom up wards which is advantageously because if the filling grows from the bottom and the sides the growth from the sides may close the entrance of the gap before the bottom is fully provided with material leaving the bottom partly empty. This may cause voids or seams in the deposited material which may deteriorate performance of the integrated circuit.

The bulk precursor may comprise metal atoms, halogen atoms and at least one additional atom not being a metal or halogen atom. The bulk precursor and the reactant may have a reaction with the first surface relative to the second surface to form more than 2, preferably more than 5, and most preferably more than 10 times more material on the first surface than on the second surface. In fact there may be zero growth on the second surface relative to the first surface as shown in FIG. 1a.

The metal may be a transition metal atom. The transition metal atom may be molybdenum (Mo). The halogen atom may be a chloride. The at least one additional atom may be selected from the chalcogenides. The at least one additional atom selected from the chalcogenides may be oxygen. The bulk precursor may comprise molybdenum pentachloride ($MoCl_5$).

The reactant may comprise hydrogen atoms. The reactant may be hydrogen ($H_2$).

The first surface may comprise a metal e.g. a transition metal. The transition metal may be selected from the group of titanium (Ti), tantalum (Ta), manganese (Mn), tungsten (W), Ruthenium (Ru), Cobalt (Co), and Cupper (Cu). The first surface may comprise a metal nitride. The second surface may comprise cobalt tungsten phosphide (CoWP). For example the second surface may comprise titanium nitride (TiN), or tantalum nitride (TaN). Alternatively the metal may be aluminum (Al).

The second surface may comprise an oxide, nitride or combination thereof. The oxide, nitride or combination thereof may be selected from the group of aluminum oxide ($AlO_x$), silicon oxide ($SiO_x$), silicon nitride (SiN), hafnium oxide ($HfO_2$), zirconium oxide ($ZrO_2$) and silicon oxynitride (SiON). The silicon oxide may be a thermal oxide of silicon. The silicon oxide may be carbon doped. The second surface may be a dielectric surface.

The deposited material may be conductive having an electrical resistivity of less than 3000 $\mu\Omega$-cm.

FIG. 1b discloses the same gap as FIG. 1a but shows that the deposition process may be hindered by contamination of the titanium nitride layer (TiN) in air. The contamination may be caused by the process depositing the silicon oxide layer with a plasma enhanced CVD process. For example, the titanium nitride may be partly oxidized or some silicon may be form contamination in the gap. The deposited material may therefore not form uniformly through the first gap B or not at all in the second gap C. The method may therefore comprise supplying a preparation precursor to the substrate.

The preparation precursor may comprises metal and halogen atoms. The preparation precursor may comprise the same metal atom as the bulk precursor such that when some of the material is deposited this material is more identical to the material that is deposited afterwards by the bulk precursor. The preparation precursor may also comprise a different metal atom as the bulk precursor. The metal in the preparation precursor may be a transition metal e.g. molybdenum. Alternatively, the metal may be selected from the group of transition metals comprising tungsten (W), Ruthenium (Ru), Cobalt (Co), and Cupper (Cu).

The preparation precursor may comprise the same halogenide as the bulk precursor such that when some of the halogenide is left behind this material is identical to the material that may be left behind in the deposition process afterwards from the bulk precursor. The preparation precursor may also comprise a different halogenide as the bulk precursor to optimize the method. The preparation precursor may comprise molybdenum pentachloride ($MoCl_5$).

The preparation precursor may work as an etchant etching away the oxide layer that is formed on the titanium nitride. The bulk precursor may thereafter better react with the native titanium nitride. The first surface may comprise a metal, metal oxide, metal nitride or silicon nitride to be cleaned with the preparation precursor.

The preparation precursor may be supplied with 10 to 2000, preferably 30 to 600, more preferably 50 to 200 and most preferably around 100 pulses into the reaction chamber and the pulses are between 0.1 and 10 seconds. The bulk precursor may be supplied with 50 to 10000, preferably 200 to 4000 more preferably 500 to 2000 and most preferably around 1000 pulses into the reaction chamber and the pulses are between 0.1 and 10 seconds.

The flow of the bulk precursor into a reaction chamber with the substrate is between 50 and 1000 sccm. The flow of the reactant into a reaction chamber with the substrate may be between 50 and 50000 sccm. The pressure in the reaction chamber may be between 0.1 and 100 Torr. The process temperature may be between 300 and 800° C.

The substrate may have a substantial horizontal top surface and a gap extending vertically in already manufactured layers and the method comprises etching the first and second surfaces of the gap before selectively depositing a material on the first surface of the gap.

Depositing the material may comprise repeating an atomic layer deposition (ALD) cycle comprising sequentially supplying pulses of the bulk precursor to the substrate; and supplying pulses of the reactant to the substrate. In between supplying the pulses of the bulk precursor and the reactant the substrate may be purged between 0.5 and 50 seconds. Supplying the bulk precursor to the substrate in the reaction chamber takes between 0.5 and 50 seconds.

The gaps may be extending vertically in already manufactured layers having a substantially horizontal top surface. Gaps in a vertical direction and provided with a metal layer may for example be used in a word line of a memory integrated circuit of the dynamic random access memory (DRAM) type. Gaps in a vertical direction and filled with a metal may for example also be used in a logic integrated circuit. For example metal filled gaps may be used as a gate fill in a P-type metal oxide semiconductor (PMOS) or complementary metal oxide semiconductor (CMOS) integrated circuit or in a source/drain trench contact.

The gaps may also be arranged in a horizontal direction in already manufactured layers. Again, the gaps may have a high aspect ratio in that their depth, now in the horizontal direction, is larger than their width. Gaps in the horizontal direction and provided with metal may for example be used in a word line of a memory integrated circuit of the 3D NAND type. The gaps may also be arranged in a combination of vertical and horizontal directions.

The surface of the gaps may comprise one sort of deposited material. Alternatively, the surface of the gaps may comprise different sorts of deposited material. The surface of the gaps may for example comprise tungsten and silicon oxide layers (see FIG. 1). When for example a conductive layer may be required to make contact with the tungsten layer it may be advantageously to deposit a conductive material selective on the tungsten in the gap with respect to the silicon layer.

To fill the complete gap the bulk layer may be deposited by sequentially repeating a bulk ALD cycle. Alternatively, the bulk layer may be deposited on the seed layer by a CVD process. The CVD process may be pulsed wherein the second precursor is supplied with pulses onto the substrate while continuously supplying the second reactant to the substrate or the other way around.

Figure 2A:
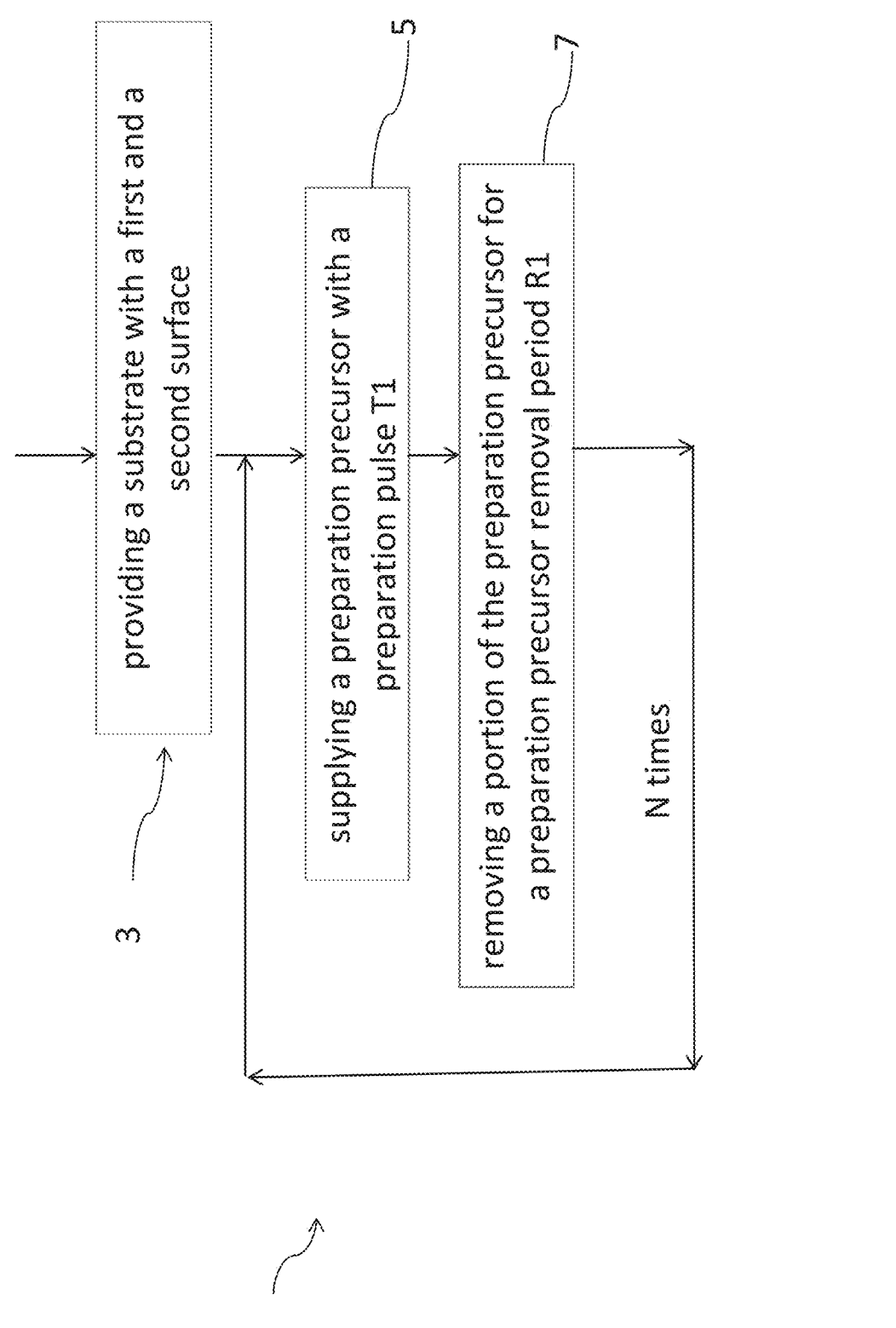
FIG. 2a show a flowchart illustrating a method of preparing depositing a layer according to an embodiment.
Figure 2B:
FIG. 2b show a flowchart illustrating a method of depositing a layer according to an embodiment.

FIGS. 2a and 2b show a flowchart illustrating a method of selectively depositing a layer according to an embodiment wherein a preparation precursor may be provided in the gap for preparation of the surface (FIG. 2a) and a bulk layer may be deposited selectively using the bulk precursor with a reactant on the prepared surface (FIG. 2b). A pretreatment cycle 1 with the preparation precursor may be shown in FIG. 2a and a bulk ALD cycle 2 for the bulk layer may be shown in FIG. 2b. The pretreatment cycle 1 with the preparation precursor may be omitted according to an embodiment. The pretreatment cycle 1 with the preparation precursor may deposit a thin seed layer according to an embodiment.

After providing a substrate with a first and second surface, the first surface being different than the second surface in step 3 in a reaction chamber a preparation precursor comprising metal and halogen atoms may be supplied to the substrate in step 5 with a preparation pulse of duration T1 (see FIG. 1a). Subsequently, additional supply of the preparation precursor to the substrate may be stopped, for example by removing e.g. purging, a portion of the preparation precursor from the reaction chamber for a preparation precursor removal period R1 in step 7. Supplying a preparation precursor comprising metal and halogen atoms may be repeated multiple cycles e.g. N times. The preparation precursor may prepare the substrate for deposition of the bulk layer and/or may react to form at least a portion of a seed layer on the substrate. Normally, it may take a few (around 50 to 100) cycles before deposition of the seed layer starts but a few cycles may be enough to prepare the surface for deposition of the bulk layer.

The preparation precursor may be selected to have a proper etching effect on the surface of the gaps. The pretreatment cycle 1 may be repeated N times to prepare the surface with N selected between 10 to 2000, preferably 30 to 600, more preferably 50 to 200 and most preferably around 100 pulses into the reaction chamber and the preparation pulses T1 are between 0.1 and 10 seconds.

A bulk precursor comprising metal and halogen atoms may be supplied to the substrate with the first and second surface in step 11 in the bulk ALD cycle 2 (see FIG. 2b) with a bulk pulse of duration T2. This may be done in the same reaction chamber as the pretreatment cycle 1 of FIG. 2a or in a different reaction chamber. It may be advantageous to do the bulk ALD cycle in a different reaction chamber than the pretreatment cycle when the temperature requirement for the pretreatment cycle may be different. A substrate transfer may therefore be necessary. The bulk ALD cycle 2 of FIG. 2b may also be accomplished without the preparation cycle of FIG. 2a. During the bulk ALD cycle additional supply of the bulk precursor to the substrate may be stopped, for example by removing e.g. purging a portion of the bulk precursor from the reaction chamber for a bulk removal period R2 in step 13.

Further, the cycle may comprise supplying 15 a reactant to the substrate with a reactant pulse for a duration T3. A portion of the bulk precursor and the reactant may react to form at least a portion of the bulk layer selectively on the first surface relative to the second surface to form more material on the first surface than on the second surface. For example the bulk precursor and the reactant may have a reaction with the first surface relative to the second surface to form more than 2, preferably more than 5, and most preferably more than 10 times more material on the first surface than on the second surface. Additional supply of the reactant to the substrate may be stopped for example by removing e.g. purging a portion of the reactant from the reaction chamber for a reactant removal period R3 in step 17.

The bulk precursor and the reactant may be selected to create proper electronical properties in the deposited material. For example to have a low electric resistivity. The molybdenum film may have an electrical resistivity of less than 3000 $\mu\Omega$-cm, or less than 1000 $\mu\Omega$-cm, or less than 500 $\mu\Omega$-cm, or less than 200 $\mu\Omega$-cm, or less than 100 $\mu\Omega$-cm, or less than 50 $\mu\Omega$-cm, or less than 25 $\mu\Omega$-cm, or less than 15 $\mu\Omega$-cm or even less than 10 $\mu\Omega$-cm.

The bulk ALD cycle 2 for the bulk layer may repeated M times with M selected between 200 and 2000, preferably 400 and 1200, and more preferably 600 and 1000. The bulk layer may have a thickness between 1 and 100, preferably 5 and 50, more preferably between 10 and 30 nm on the first surface of the substrate.

The preparation and bulk precursor may comprise the same metal atom. The metal may be a transition metal atom. The transition metal atom may be Molybdenum. The preparation and bulk precursor may comprise the same halogen atom. The halogen atom may be a chloride. By having the same metal atom and or the same halogen the qualification of the tool and the process in the fab may be simplified since only one metal atom and/or one halogen may need to be assessed. If the preparation precursor comprises the same metal atom as the bulk precursor some deposition of the material during preparation may be no problem since it is more identical to the material that is deposited afterwards by the bulk precursor. If the preparation precursor comprises the same halogenide as the bulk precursor some of the halogenide that may be left behind is identical to the material that may be left behind in the deposition process afterwards from the bulk precursor simplifying qualification of the process. The preparation precursor may comprise molybdenum pentachloride (MoCl$_5$).

The process temperature in the reaction chamber may be selected between 300 and 800, preferably 400 and 700, and more preferably 450 and 550° C. during the pretreatment ALD cycle. The vessel in which the preparation precursor is vaporized may be maintained between 40 and 100, preferably 60 and 80, and more preferably around 70° C.

The bulk precursor may comprise an additional atom not being a metal or halogen atom. The additional atom may be a chalcogen. The chalcogen may be oxygen, sulfur, selenium or tellurium. The bulk precursor may comprise molybdenum (VI) dichloride dioxide (MoO$_2$Cl$_2$).

The process temperature may be between 300 and 800, preferably 400 and 700, and more preferably 500 and 650° C. during the bulk ALD cycle. The vessel in which the second precursor is vaporized may be maintained between 20 and 150, preferably 30 and 120, and more preferably 40 and 110° C.

Supplying the preparation and/or bulk precursor into the reaction chamber may be accomplished with pulses having a duration T1, T2 respectively, which may be selected between 0.1 and 10, preferably 0.5 and 5, and more preferably 0.8 and 2 seconds. For example, T1 may be 1 second and T2 may be 1.3 seconds. The flow of the preparation and/or bulk precursor into the reaction chamber may be selected between 10 to 2000, 50 and 1000, preferably 100 and 500, and more preferably 200 and 400 sccm. The pressure in the reaction chamber may be selected between 0.1 and 100, preferably 1 and 50, and more preferably 4 and 20 Torr.

The reactant may have hydrogen atoms e.g. hydrogen ($H_2$). Supplying the reactant into the reaction chamber with a reactant pulse may have a duration T3 between 0.5 and 50, preferably 1 and 10, and more preferably 2 and 8 seconds. The flow of the reactant into the reaction chamber may be between 50 and 50000, preferably 100 and 20000, and more preferably 500 and 10000 sccm.

Silane may be considered for the reactant. The general formula for silane is $Si_xH2_{(x+2)}$ where x is an integer 1, 2, 3, 4 . . . Silane ($SiH_4$), disilane ($Si_2H_6$) or trisilane ($Si_3H_8$) may be suitable examples for the reactant having hydrogen atoms.

Removing e.g. purging a portion of at least one of the preparation precursor, the bulk precursor and the reactant from the reaction chamber may be done in a removal period R1, R2, R3, of between 0.5 and 50, preferably 1 and 10, and more preferably 2 and 8 seconds. Purging may be used after supplying the preparation precursor to the substrate; after supplying the bulk precursor; or after supplying the reactant to remove a portion of at least one of the preparation precursor, the bulk precursor or the reactant from the reaction chamber for a removal period R1, R2, R3. Removing may be accomplished by pumping and/or by providing a purge gas. The purge gas may be an inert gas such as nitrogen or helium.

The method may be used in a single or batch wafer ALD apparatus. The method comprising providing the substrate in a reaction chamber and the pretreatment cycles in the reaction chamber may comprise: supplying the preparation precursor to the substrate in the reaction chamber and purging a portion of the preparation precursor from the reaction chamber. Further the method comprises providing the substrate in a reaction chamber and the bulk ALD cycles in the reaction chamber comprises: supplying the bulk precursor to the substrate in the reaction chamber; purging a portion of the second precursor from the reaction chamber; supplying the reactant to the substrate in the reaction chamber; and purging a portion of the reactant from the reaction chamber.

Exemplary single wafer reactors, designed specifically to perform ALD processes, are commercially available from ASM International NV (Almere, The Netherlands) under the tradenames Pulsar®, Emerald®, Dragon® and Eagle®. The method may also be performed in a batch wafer reactor e.g. a vertical furnace. For example, the deposition processes may be performed in an A412™ vertical furnace available from ASM International N.V. as well. The furnace may have a process chamber that can accommodate a load of 150 semiconductor substrates, or wafers, having a diameter of 300 mm.

The wafer reactors may be provided with a controller and a memory which may control the reactor. The memory may be programmed with a program to supply the precursors and the reactants in the reaction chamber in accordance with the embodiments of this disclosure when executed on the controller.

Figures 3A, 3B:
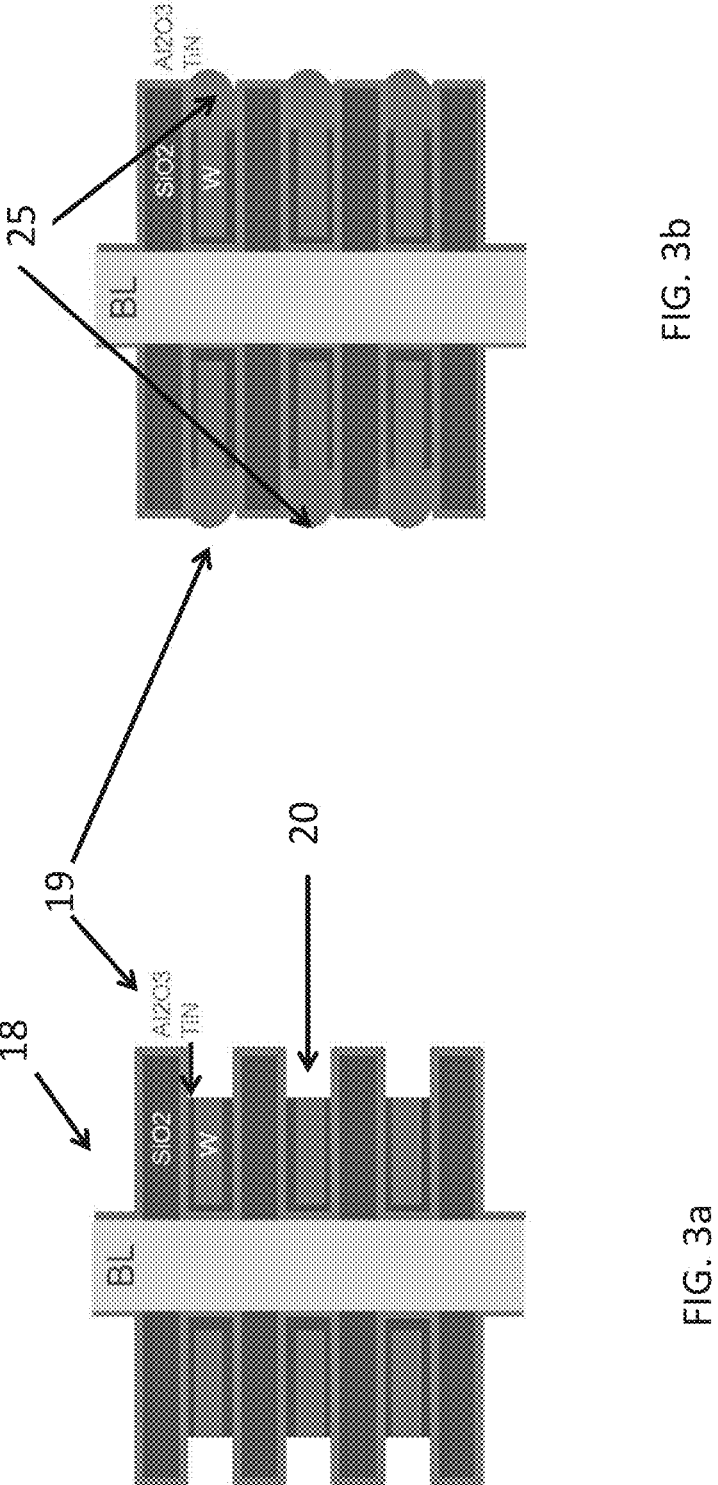
FIG. 3a shows a cross-section of a gap structure in a substrate to be filled according to an embodiment.
FIG. 3b shows a cross-section of the gap structure of FIG. 3a filled according to the embodiment.

FIG. 3a shows a cross-section of a structure 18 with a sidewall 19 extending along a gap and having holes 20 to be filled according to an embodiment. As shown the gap may be extending vertically in already manufactured layers on a substrate. The already manufactured layers may comprise for example silicon oxide $SiO_2$, aluminum oxide $Al_2O_3$, titanium nitride TiN and tungsten W.

The gaps may have a high aspect ratio in that the depth vertically and or horizontally is much larger than the width. The aspect ratios (gap depth/gap width) of the gap may be more than about 2, more than about 5, more than about 10, more than about 20, more than about 50, more than about 75 or in some instances even more than about 100 or more than about 150 or more than about 200.

It may be noted that the aspect ratio may be difficult to determine for the gap, but in this context the aspect ratio may be replaced by the surface enhancement ratio which may be the ratio of the total surface area of the gap in the wafer or part of the wafer in relation to the planar surface area of wafer or part of the wafer. The surface enhancement ratio (surface gaps/surface wafer) of the gap may be more than about 2, more than about 5, more than about 10, more than about 20, more than about 50, more than about 75 or in some instances even more than about 100 or more than about 150 or more than about 200.

The structure of FIG. 3a is created by an etch to make the different layers of tungsten W accessible from the gap to remove the surface of the side wall 19 of the gap to a small extent. During etch back the different layers tungsten W and aluminum oxide $Al_2O_3$ are differently etched causing the tungsten W to be etched further than necessary which creates the holes 20. The surface of the hole 20 after etching may comprise different sorts of deposited layers for example a first surface being electrical conductive and comprising tungsten W and titanium nitride TiN and a second surface being electrical insulting and comprising aluminum oxide $Al_2O_3$ and silicon oxide $SiO_2$.

A selective metal 25 may be deposited on the first surface comprising tungsten W relative to the second surface comprising silicon oxide $Al_2O_3$. The selective metal 25 may be deposited on the surface 19 of the gap by depositing a layer by sequentially repeating a deposition cycle according to an embodiment as depicted in FIG. 2b. A pretreatment cycle with a preparation precursor a depicted in FIG. 2a may be applied. A bulk layer may be deposited by sequentially repeating an ALD cycle with a bulk precursor according to the embodiment. Details of the used method are shown in FIGS. 2a and 2b and the related description.

The metal 25 may comprise molybdenum having an electrical resistivity of less than 3000 $\mu\Omega$-cm, or less than 1000 $\mu\Omega$-cm, or less than 500 $\mu\Omega$-cm, or less than 200 $\mu\Omega$-cm, or less than 100 $\mu\Omega$-cm, or less than 50 $\mu\Omega$-cm, or less than 25 $\mu\Omega$-cm, or less than 15 $\mu\Omega$-cm or even less than 10 $\mu\Omega$-cm. In some embodiments, a deposited layer 25 comprising Mo may have a step coverage greater than about 50%, greater than about 80%, greater than about 90%, greater than about 95%, greater than about 98%, greater than about 99%.

The method may be performed in an atomic layer deposition apparatus. For example, the deposition processes may be performed in an EMERALD® XP ALD apparatus.

The method may also be used in a spatial atomic layer deposition apparatus. In spatial ALD, the precursor and reactant are supplied continuously in different physical sections and the substrate is moving between the sections. There may be provided at least two sections where, in the presence of a substrate, a half-reaction can take place. If the substrate is present in such a half-reaction section a monolayer may form from the first or second precursor. Then, the substrate is moved to the second half-reaction zone, where the ALD cycle is completed with the first or second reactant to form one ALD monolayer. Alternatively the substrate position could be fixed and the gas supplies could be moved, or some combination of the two. To obtain thicker films, this sequence may be repeated.

Accordingly to an embodiment in a spatial ALD apparatus the pretreatment method comprises:

placing the substrate in a reaction chamber comprising a plurality of sections, each section separated from adjacent sections by a gas curtain;

supplying the pretreatment precursor to the substrate in a first section of the reaction chamber;

laterally moving the substrate surface with respect to the reaction chamber through a gas curtain to a second section of the reaction chamber;

supplying the first reactant to the substrate in the second section of the reaction chamber;

laterally moving the substrate surface with respect to the reaction chamber through a gas curtain; and repeating supplying the pretreatment precursor and the reactant including lateral movement of the substrate surface with respect to the reaction chamber.

To form the bulk layer the method further comprises:

placing the substrate in a reaction chamber comprising a plurality of sections, each section separated from adjacent sections by a gas curtain;

supplying the bulk precursor to the substrate in a first section of the reaction chamber;

laterally moving the substrate surface with respect to the reaction chamber through a gas curtain to a second section of the reaction chamber;

supplying the second reactant to the substrate in the second section of the reaction chamber to form the bulk layer;

laterally moving the substrate surface with respect to the reaction chamber through a gas curtain; and repeating supplying the bulk precursor and the reactant including lateral movement of the substrate surface with respect to the reaction chamber to form the bulk layer.

Exemplary single wafer reactors, designed specifically to perform CVD processes, are commercially available from ASM International NV (Almere, The Netherlands) under the tradenames Dragon®. The method may also be performed in a batch wafer reactor e.g. a vertical furnace. For example, the deposition processes may be performed in an A400™, or A412™ vertical furnace available from ASM International N.V. as well. The furnace may have a process chamber that can accommodate a load of 100 or more semiconductor substrates, or wafers.

In additional embodiments the bulk layer may comprise less than about 40 at. %, less than about 30 at. %, less than about 20 at. %, less than about 10 at. %, less than about 5 at. %, or even less than about 2 at. % oxygen. In further embodiments, the bulk layer may comprise less than about 30 at. %, less than about 20 at. %, less than about 10 at. %, or less than about 5 at. %, or less than about 2 at. %, or even less than about 1 at. % of hydrogen. In some embodiments, the bulk layer may comprise halide or chloride less than about 10 at. %, or less than about 5 at. %, less than about 1 at. %, or even less than about 0.5 at. %. In yet further embodiments, the bulk layer may comprise less than about 10 at. %, or less than about 5 at. %, or less than about 2 at. %, or less than about 1 at. %, or even less than about 0.5 at. % carbon. In the embodiments outlined herein, the atomic percentage (at. %) concentration of an element may be determined utilizing Rutherford backscattering (RBS).

In some embodiments of the disclosure, forming a semiconductor device structure, such as semiconductor device structure, may comprise forming a gate electrode structure comprising a molybdenum film, the gate electrode structure having an effective work function greater than approximately 4.9 eV, or greater than approximately 5.0 eV, or greater than approximately 5.1 eV, or greater than approximately 5.2 eV, or greater than approximately 5.3 eV, or even greater than approximately 5.4 eV. In some embodiments, the effective work function values give above may be demonstrated for an electrode structure comprising a molybdenum film with a thickness of less than approximately 100 Angstroms, or less than approximately 50 Angstroms, or less than approximately 40 Angstroms, or even less than approximately 30 Angstroms.

It will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in any order. All such modifications and changes are intended to fall within the scope of the invention, as defined by the appended claims.

What is claimed is:

1. A method of selectively depositing a metal on a substrate, the method comprising:

providing a substrate comprising a gap with a first surface at a bottom of the gap and a second surface at a top of the gap, the first surface being different than the second surface;

depositing the metal on the substrate by repeating the steps of:

supplying a bulk precursor comprising a transition metal atom, a halogen atom, and at least one chalcogen atom; and supplying a reactant to the substrate, whereby the bulk precursor and the reactant have a reaction with the first surface relative to the second surface to form more material on the first surface than on the second surface to thereby fill the gap with the metal, and wherein the reactant comprises a silane.

2. The method according to claim 1, wherein the bulk precursor and the reactant have a reaction with the first surface relative to the second surface to form more than 5 times more material on the first surface than on the second surface.

3. The method according to claim 1, wherein the bulk precursor consists of one or more of the metal atoms, one or more of the halogen atoms, and the at least one chalcogen atom.

4. The method according to claim 1, wherein the transition metal atom is molybdenum.

5. The method according to claim 1, wherein the halogen atom is chloride.

6. The method according to claim 1, wherein the first surface comprises cobalt tungsten phosphide, titanium nitride, tantalum nitride, or aluminum.

7. The method according to claim 1, wherein the at least one chalcogen atom comprises oxygen.

8. The method according to claim 1, further comprising supplying a preparation precursor to the substrate, wherein the preparation precursor comprises the metal atom and/or the halogen atoms to clean the first surface.

9. The method according to claim 1, wherein the silane comprises silane ($SiH_4$), disilane ($Si_2H_6$) or trisilane ($Si_3H_8$) hydrogen atoms.

10. A method of selectively depositing a transition metal on a substrate, the method comprising:

providing a substrate with a gap having a bottom comprising a first surface and a top comprising a second surface, the first surface being different than the second surface;

supplying a preparation precursor to the substrate; and depositing the transition metal on the substrate by:

supplying a bulk precursor comprising a transition metal atom, a halogen atom, and at least one additional atom not being a metal or halogen atom; and supplying a reactant to the substrate, whereby the bulk precursor and the reactant have a reaction with the first surface relative to the second surface to form more material on the first surface than on the second surface to thereby fill the gap with the transition metal, and wherein the preparation precursor and the bulk precursor are different.

11. The method according to claim 10, wherein the first surface comprises a metal.

12. The method according to claim 11, wherein the metal comprises a transition metal.

13. The method according to claim 12, wherein the transition metal is selected form the group of titanium (Ti), tantalum (Ta), manganese (Mn), tungsten (W), Ruthenium (Ru), Cobalt (Co), and Cupper (Cu).

14. The method according to claim 12, wherein the first surface comprises a transition metal nitride.

15. The method according to claim 10, wherein the second surface comprises an oxide, nitride, or combination thereof.

16. The method according to claim 10, wherein the second surface is selected from the group of $AlO_x$, $SiO_x$, SiN, $HfO_2$, $ZrO_2$ and SiON.

17. The method according to claim 10, wherein the second surface is a dielectric surface.

18. The method according to claim 10, wherein the preparation precursor comprises a transition metal and a halogen.

19. The method according to claim 10, wherein the bulk precursor and the preparation precursor comprise the same halogen.

20. A method of selectively depositing a transition metal on a substrate, the method comprising:

providing a substrate with a gap having a bottom comprising a first surface and a top comprising a second surface, the first surface being different than the second surface;

pulsing a preparation precursor into a reaction chamber to remove contamination from the first surface; and depositing the transition metal on the substrate by:

supplying a bulk precursor comprising a transition metal atom, a halogen atom, and at least one additional atom not being a metal or halogen atom; and supplying a reactant to the substrate, whereby the bulk precursor and the reactant have a reaction with the first surface relative to the second surface to form more material on the first surface than on the second surface to thereby fill the gap with the transition metal.

\* \* \* \* \*